United States Patent
Yoo

(10) Patent No.: US 9,373,402 B2
(45) Date of Patent: Jun. 21, 2016

(54) SEMICONDUCTOR MEMORY DEVICE INCLUDING A DUMMY MEMORY CELL AND METHOD OF PROGRAMMING THE SAME

(71) Applicant: SK hynix Inc., Icheon-si Gyeonggi-do (KR)

(72) Inventor: Hyun Seung Yoo, Yongin-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 17 days.

(21) Appl. No.: 14/619,770

(22) Filed: Feb. 11, 2015

(65) Prior Publication Data

US 2016/0099060 A1 Apr. 7, 2016

(30) Foreign Application Priority Data

Oct. 2, 2014 (KR) .......................... 10-2014-0133331

(51) Int. Cl.
  *G11C 16/10* (2006.01)
  *G11C 16/04* (2006.01)
  *G11C 16/06* (2006.01)
  *G11C 29/24* (2006.01)

(52) U.S. Cl.
  CPC ............ *G11C 16/10* (2013.01); *G11C 16/0483* (2013.01); *G11C 16/06* (2013.01); *G11C 29/24* (2013.01)

(58) Field of Classification Search
  CPC .... G11C 16/0483; G11C 16/06; G11C 16/10; G11C 29/24
  See application file for complete search history.

(56) References Cited

U.S. PATENT DOCUMENTS

| | | | | |
|---|---|---|---|---|
| 7,933,154 B2 * | 4/2011 | Kang | ................. | G11C 16/0483 365/185.11 |
| 8,804,417 B2 * | 8/2014 | Park | ...................... | G11C 16/10 365/185.02 |
| 9,257,185 B2 * | 2/2016 | Park | ...................... | G11C 16/10 |
| 2009/0273978 A1 * | 11/2009 | Fukuda | .............. | G11C 16/3404 365/185.17 |
| 2012/0176836 A1 * | 7/2012 | Iguchi | ................ | G11C 16/0483 365/185.2 |
| 2012/0307561 A1 * | 12/2012 | Joo | ..................... | G11C 16/0483 365/483 |
| 2014/0036598 A1 * | 2/2014 | Yang | .................. | G11C 11/5635 365/185.22 |
| 2015/0294724 A1 * | 10/2015 | Nam | .................. | G11C 16/0483 365/185.11 |

FOREIGN PATENT DOCUMENTS

| KR | 101075505 B1 | 10/2011 |
|---|---|---|
| KR | 1020110135693 A | 12/2011 |
| KR | 1020120134941 A | 12/2012 |

\* cited by examiner

*Primary Examiner* — Vanthu Nguyen
(74) *Attorney, Agent, or Firm* — William Park & Associates Ltd.

(57) ABSTRACT

A semiconductor memory and a method of programming the same are provided. A semiconductor memory device may include a memory cell array including a plurality of normal memory cells, a select transistor, and a dummy memory cell. The semiconductor memory device may include a voltage generator configured for generating a program voltage applied to a normal memory cell selected among the plurality of normal memory cells, and for generating a dummy word line voltage applied to the dummy memory cell in a program operation. The semiconductor memory device may include a control logic configured for controlling the voltage generator to adjust the dummy word line voltage based on the program voltage.

20 Claims, 14 Drawing Sheets

FIG. 7

| Line | voltage |
|---|---|
| DSL1 | Vtrn |
| DSL2 | Vtrf |
| DWL2 | Vdwl2 |
| DWL1 | Vdwl1 |
| WLsel | Vpgm |
| WLusel | Vpass |
| SWL2 | Vswl2 |
| SWL1 | Vswl1 |
| SSL1 | Vtrf |
| SSL2 | Vtrf |

SEMICONDUCTOR MEMORY DEVICE INCLUDING A DUMMY MEMORY CELL AND METHOD OF PROGRAMMING THE SAME

CROSS-REFERENCE TO RELATED APPLICATION

The present application claims priority to Korean patent application number 10-2014-0133331 filed on Oct. 2, 2014, in the Korean Intellectual Property Office, the entire disclosure of which is incorporated by reference herein.

BACKGROUND

1. Technical Field

Embodiments of the present disclosure generally relate to an electronic device, more particularly, to a semiconductor memory device including a dummy memory cell and a method of programming the same.

2. Related Art

A semiconductor memory device is a memory device embodied using a semiconductor formed of silicon (Si), germanium (Ge), gallium arsenide (GaAs), indium phosphide (InP), and/or the like. Semiconductor memory devices may be classified into to main categories. One category may be for volatile memory devices and the other for nonvolatile memory devices.

When the supply of electric power is cut off, data stored in the volatile memory is erased. The volatile memory device may include a static RAM (SRAM), a dynamic RAM (DRAM), a synchronous DRAM (SDRAM), and/or the like. Although the supply of electric power may be cut off, the nonvolatile memory device maintains data stored within itself. The nonvolatile memory device may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and/or the like. Flash memory may be classified as either a NOR type or a NAND type.

Semiconductor memory devices may include a memory cell array. The memory cell array may include normal memory cells for storing data, and dummy memory cells for improving the reliability of the memory cell array.

BRIEF SUMMARY

According to an embodiment, a semiconductor memory device may include a memory cell array including a plurality of normal memory cells, a select transistor, and a dummy memory cell connected between the plurality of normal memory cells and the select transistor. The semiconductor memory device may include a voltage generator configured for generating a program voltage applied to a normal memory cell selected among the plurality of normal memory cells, and for generating a dummy word line voltage applied to the dummy memory cell in a program operation. The semiconductor memory device may include a control logic configured for controlling the voltage generator to adjust the dummy word line voltage based on the program voltage.

According to an embodiment, a semiconductor memory device may include a plurality of memory blocks including a plurality of normal memory cells, a select transistor, and a plurality of dummy memory cells connected between the plurality of normal memory cells and the select transistor. The semiconductor memory device may include a peripheral circuit configured for applying first and second dummy word line voltages to first and second dummy memory cells among the plurality of dummy memory cells when a first program voltage is applied to a selected normal memory cell among the plurality of normal memory cells of a selected memory block. The peripheral circuit may apply a third dummy word line voltage, higher than the first dummy word line voltage, to the first dummy memory cell and may apply a fourth dummy word line voltage, higher than the second dummy word line voltage, to the second dummy memory cell, when a second program voltage, higher than the first program voltage, is applied to the selected normal memory cell.

According to an embodiment, a method of programming a semiconductor memory device is provided. The method of programming the semiconductor memory device according to an embodiment may include applying a first program voltage to a memory cell selected among the plurality of normal memory cells and applying a first dummy word line voltage to the dummy memory cell to perform a first program loop. The method may also include, after the first program loop, applying a second program voltage, higher than the first program voltage, to the selected memory cell and applying a second dummy word line voltage, higher than the first dummy word line voltage, to the dummy memory cell to perform a second program loop.

BRIEF DESCRIPTION OF THE DRAWINGS

FIG. 7 is a table illustrating an example of a representation of voltages applied to a selected memory block in a program operation according to an embodiment.

DETAILED DESCRIPTION

Hereinafter, various embodiments will be described with reference to the accompanying drawings. In the following description and the appended drawings, detailed descriptions of well-known functions or constructions will be omitted if they obscure the application with unnecessary detail. Also, the embodiments may be embodied in different forms and should not be construed as limited to the embodiments set forth herein.

Throughout this specification, it will be understood that when a portion is "connected to" another portion, the portion may be "directly connected to" another portion, or the portion may be "indirectly connected to" another portion with an intervening element between the portions. Throughout this specification, it will be understood that when a portion "includes" another portion, without any contrary statement, the portion should not exclude another element, but may include another element.

The embodiments may be directed at semiconductor memory devices having increased reliability, and methods of programming the same.

Figure 1:
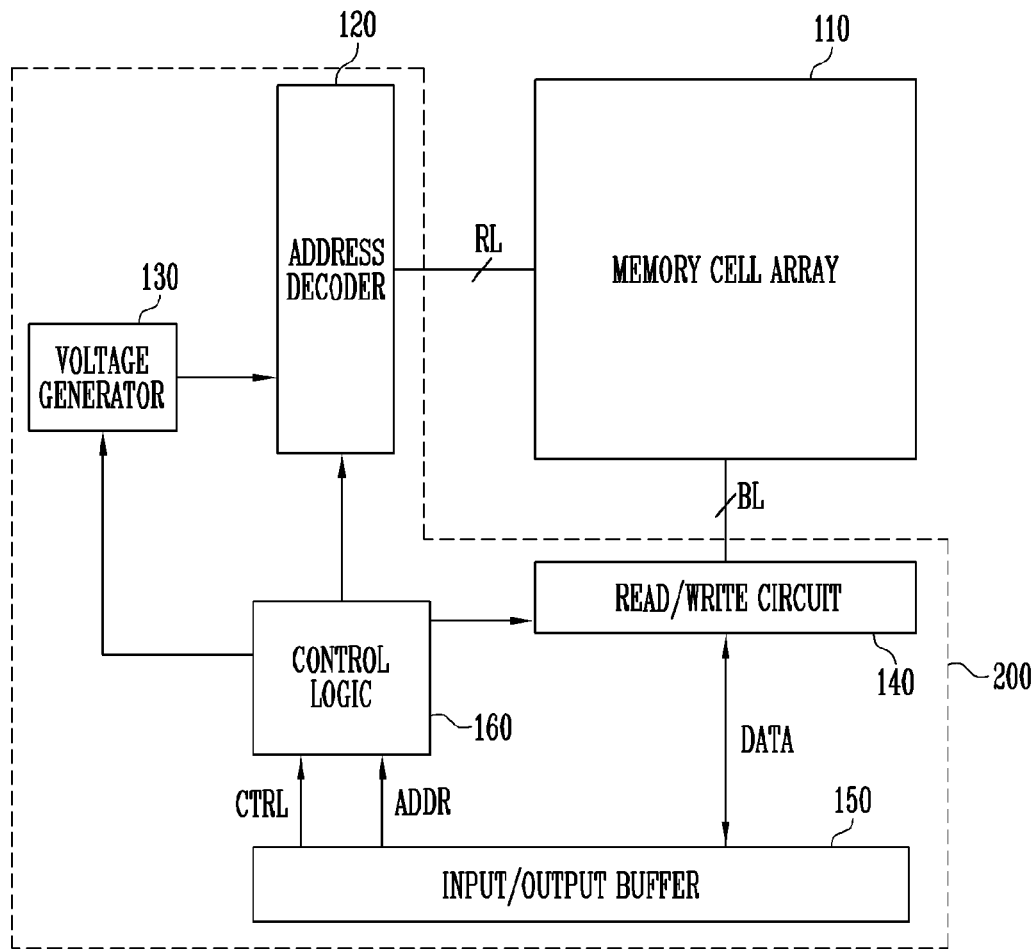
FIG. 1 is a block diagram illustrating an example of a representation of a semiconductor memory device.

FIG. 1 is a block diagram illustrating an example of a representation of a semiconductor memory device 100 according to an embodiment.

Referring to FIG. 1, the semiconductor memory device 100 may include a memory cell array 110, an address decoder 120, and a voltage generator 130. The semiconductor memory device 100 may include a read/write circuit 140, an input/output buffer 150, and a control logic 160.

The memory cell array 110 may be connected to the address decoder 120 through row lines RL. The memory cell array 110 may be connected to the read/write circuit 140 through bit lines BL.

The memory cell array 110 may include a plurality of memory blocks. Each of the plurality of memory blocks may include a plurality of memory cells stacked above a substrate. In an embodiment, the plurality of memory cells may be nonvolatile memory cells. In an embodiment, the plurality of memory cells may be defined as a single level cell or a multi level cell. The memory cell array 110 is explained below with reference to FIGS. 2 to 4.

The address decoder 120 may be connected to the memory cell array 110 through the row lines RL. The row lines RL may include drain select lines, normal word lines, dummy word lines, source select lines, and a common source line. In an embodiment, the row lines RL may further include a pipe select line.

The address decoder 120 may be configured to operate the row lines RL in response to a control of the control logic 160. The address decoder 120 may receive an address ADDR from the control logic 160.

In an embodiment, in a program operation and a read operation, the address ADDR may include a block address and a row address. The address decoder 120 may be configured to decode the received address ADDR. The address decoder 120 may select one memory block based on the decoded block address. The address decoder 120 may be configured to decode a row address among the received address ADDR. The address decoder 120 may select any one of the drain select lines of the selected memory block based on the decoded row address, and may select any one among the plurality of word lines of the selected memory block. Thus, normal memory cells corresponding to one page may be selected.

In an embodiment, in an erase operation, the address ADDR may include the block address. The address decoder 120 may decode the block address, and may select one memory block based on the decoded block address. Data of the selected memory block may be erased.

In an embodiment, the address decoder 120 may include a block decoder, a row decoder, and an address buffer, and/or the like.

The voltage generator 130 may operate in response to the control of the control logic 160. The voltage generator 130 may generate an internal power voltage using an external power voltage to be supplied to the semiconductor memory device 100. For example, the voltage generator 130 may regulate the external power voltage, and thus, generates the internal power voltage. The internal power voltage generated by the voltage generator 130 may be supplied to the address decoder 120, the read/write circuit 140, the input/output buffer 150, and the control logic 160, and may be used as an operation voltage of the semiconductor memory device 100.

The voltage generator 130 may generate a plurality of voltages using at least one of the external power voltage and the internal power voltage. In an embodiment, the voltage generator 130 may include a plurality of pumping capacitors receiving the internal power voltage, and may selectively activate the plurality of pumping capacitors in response to the control of the control logic 160, thereby generating the plurality of voltages. The voltage generator 130 may generate various voltages to be applied to the row lines, and supply the generated voltages to the address decoder 120. For example, in the program operation, the voltage generator 130 may generate a program voltage of a high voltage, and the address decoder 120 may apply the generated program voltage to a selected normal word line. In the program operation, the voltage generator 130 may generate a pass voltage lower than the program voltage, and the address decoder 120 may apply the generated pass voltage to non-selected normal word lines.

The read/write circuit 140 may be connected to the memory cell array 110 through the bit lines BL. The read/write circuit 140 may operate in response to the control of the control logic 160.

The read/write circuit 140 may communicate data DATA with the input/output buffer 150. In the program operation, the read/write circuit 140 may receive data DATA through the input/output buffer 150. In the read operation, the read/write circuit 140 may output the data DATA to the input/output buffer 150.

In an embodiment, the read/write circuit 140 may include page buffers (or page registers), column selection circuits, and/or the like.

The input/output buffer 150 may receive a control signal CTRL and an address ADDR from the outside, and may transmit the received control signal CTRL and address ADDR to the control logic 160. The input/output buffer 150 may be configured to transmit the data DATA, input from the outside, to the read/write circuit 140 during the program operation. The input/output buffer 150 may output the data DATA, received from the read/write circuit 140, to the outside during the read operation.

The control logic 160 may be connected to the address decoder 120, the voltage generator 130, the read/write circuit 140, and the input/output buffer 150. The control logic 160 may receive the control signal CTRL and the address ADDR from input/output buffer 150. The control logic 160 may be configured to control overall operations of the semiconductor memory device 100 in response to the control signal CTRL. The control logic 160 may transmit the address ADDR to the address decoder 120.

In an embodiment, the semiconductor memory device 100 may be a flash memory device.

Figure 2:
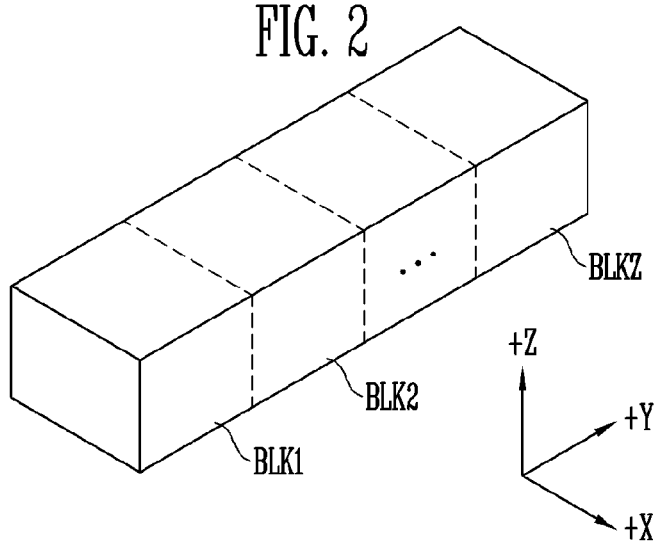
FIG. 2 is a block diagram illustrating an example of a representation of an embodiment of a memory cell array illustrated in FIG. 1.

FIG. 2 is a block diagram illustrating an example of a representation of an embodiment of a memory cell array 110 illustrated in FIG. 1.

Referring to FIG. 2, the memory cell array 110 may include a plurality of memory blocks BLK1 to BLKz. Each of the memory blocks BLK1 to BLKz may have a 3-dimensional structure. Each of the memory blocks BLK1 to BLKz may include a plurality of memory cells stacked on a substrate. The plurality of memory cells may be arranged in a +X direction, a +Y direction, and a +Z direction. A structure of each memory block will be explained with reference to FIG. 3.

Figure 3:
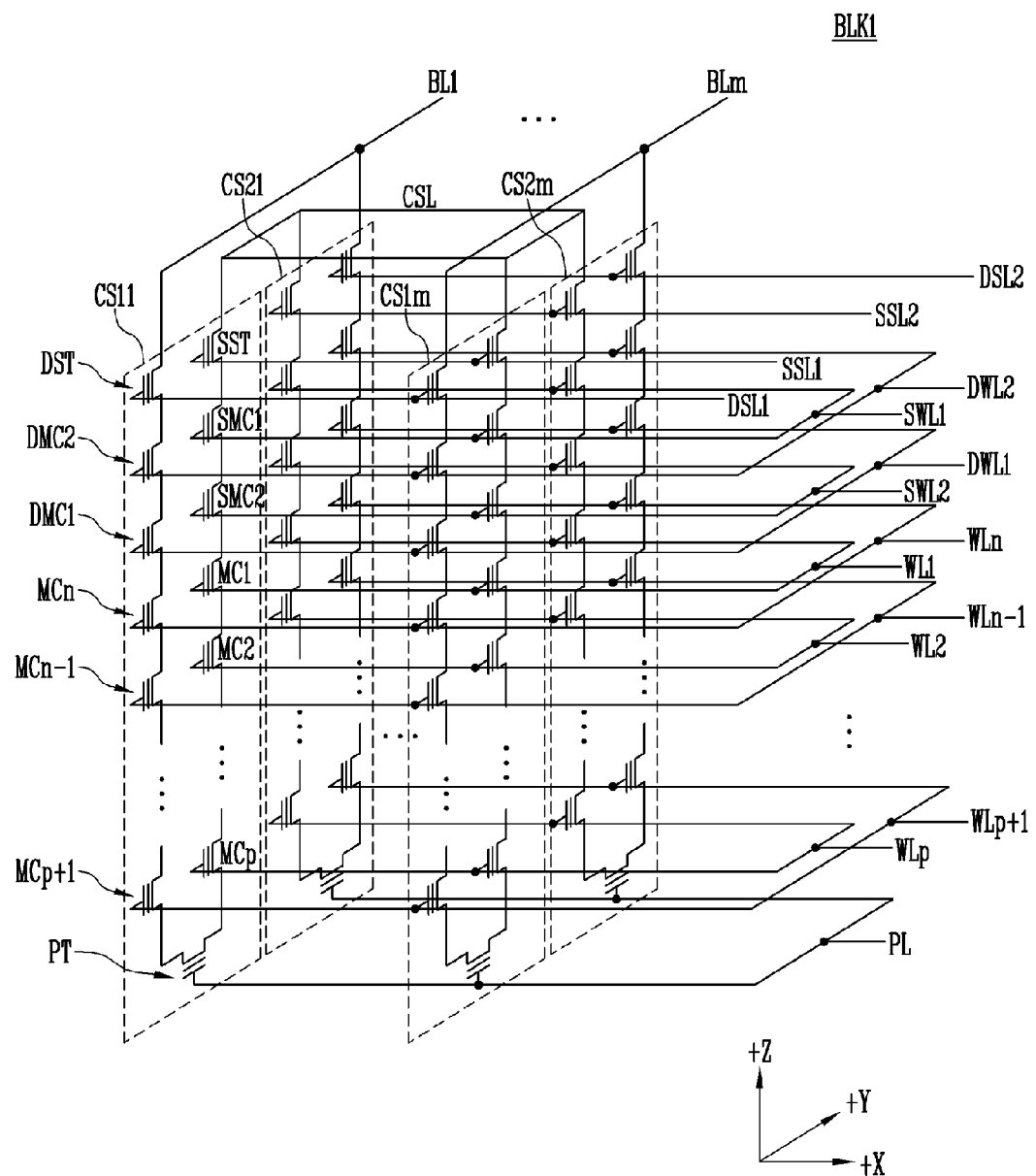
FIG. 3 is a circuit diagram illustrating an example of a representation of any one of memory blocks illustrated in FIG. 2 according to an embodiment.

FIG. 3 is a circuit diagram illustrating an example of a representation of any one memory block (i.e., BLK1) of memory blocks BLK1 to BLKz illustrated in FIG. 2.

Referring to FIG. 3, the first memory block BLK1 may include a plurality of cell strings CS11 to CS1$m$, CS21 to CS2$m$. Each of the plurality of cell strings CS11 to CS1$m$, CS21 to CS2$m$ may be in a 'U' shape. In the first memory block BLK1, m cell strings are arranged in a row direction (that is, the +X direction). In FIG. 3, two cell strings are arranged in a column direction (that is, the +Y direction). However, this is only for convenience of explanation, and it will be understood that three or more cell strings may be arranged in the column direction.

Each of the plurality of cell strings CS11 to CS1$m$, CS21 to CS2$m$ may include at least one source select transistor SST, at least one of source side dummy memory cells SMC1 and SMC2, first to $n^{th}$ normal memory cells MC1 to MCn, and a pipe transistor PT. Each of the plurality of cell strings CS11 to CS1$m$, CS21 to CS2$m$ may include at least one of drain side dummy memory cells DMC1 and DMC2 and at least one drain select transistor DST.

Each of the select transistors SST and DST, and the dummy memory cells SMC1, SMC2, DMC1, and DMC2, and the normal memory cells MC1 to MCn may have a similar structure. In an embodiment, each of the select transistors SST and DST, and the dummy memory cells SMC1, SMC2, DMC1, and DMC2, and the normal memory cells MC1 to MCn may include a channel layer, a tunneling insulating layer, a charge storage layer, and a blocking insulating layer.

The source select transistor SST of each cell string may be connected between the common source line CSL and the source side dummy memory cells SMC1 and SMC2. A source of the source select transistor SST may be connected to the common source line CSL.

In an embodiment, source select transistors of cell strings arranged in the same row are connected to a source select line, extending in the row direction. Source select transistors of cell strings arranged in different rows are connected to different source select lines. In FIG. 3, source select transistors of cell strings CS11 to CS1$m$ of the first row are connected to a first source select line SSL1. Source select transistors of cell strings CS21 to CS2$m$ of the second row are connected to a second source select line SSL2.

Two source side dummy memory cells SMC1 and SMC2 may be provided to each cell string. The source side dummy memory cells SMC1 and SMC2 of each cell string may be connected in series between the source select transistor SST and the normal memory cells MC1 to MCp. Gates of source side dummy memory cells at the same height or substantially the same height may be connected to one source side dummy word line. A gate of a first source side dummy memory cell SMC1 of each cell string may be connected to a first source side dummy word line SWL1. A gate of a second source side dummy memory cell SMC2 of each cell string may be connected to a second source side dummy word line SWL2.

The first to $n^{th}$ memory cells MC1 to MCn of each cell string may be connected between the source side dummy memory cells SMC1 and SMC2 and the drain side dummy memory cells DMC1 and DMC2.

The first to $n^{th}$ normal memory cells MC1 to MCn may be classified into first to $p^{th}$ normal memory cells MC1 to MCp and p+1$^{th}$ to $n^{th}$ normal memory cells MCp+1 to MCn. The first to $p^{th}$ normal memory cells MC1 to MCp and the p+1$^{th}$ to $n^{th}$ normal memory cells MCp+1 to MCn may be connected through the pipe transistor PT.

The first to $p^{th}$ normal memory cells MC1 to MCp may be arranged in sequence in a reverse direction of the +Z direction and may be connected in series between the source side dummy memory cells SMC1 and SMC2 and the pipe transistor PT. The p+1$^{th}$ to $n^{th}$ normal memory cells MCp+1 to MCn may be arranged in sequence in the +Z direction, and may be connected in series between the pipe transistor PT and the drain side dummy memory cells DMC1 and DMC2. Gates of the first to $n^{th}$ normal memory cells MC1 to MCn of each cell string may be connected to the first to $n^{th}$ normal word lines WL1 to WLn.

Data may be stored in the first to $n^{th}$ normal memory cells MC1 to MCn through the first to $m^{th}$ bit lines BL1 to BLm. The data stored in the first to $n^{th}$ normal memory cells MC1 to MCn may be read through the first to $m^{th}$ bit lines BL1 to BLm.

The gate of the pipe transistor PT of each cell string may be connected to the pipe line PL.

In FIG. 3, two drain side dummy memory cells DMC1 and DMC2 may be provided in each cell string. The drain side dummy memory cells DMC1 and DMC2 of each of the cell strings may be connected between the drain select transistor DST and the normal memory cells MCp+1 to MCn. Gates of drain side dummy memory cells at the same height or substantially the same height may be connected to one drain side dummy word line. Gates of drain side dummy memory cells at different heights may be connected to different drain side dummy word lines. A gate of a first drain side dummy memory cell DMC1 of each cell string is connected to a first drain side dummy word line DWL1. A gate of a second drain side dummy memory cell DMC2 of each cell string may be connected to a second drain side dummy word line DWL2.

The dummy memory cells SMC1, SMC2, DMC1, and DMC2 may not be used to store data.

The drain select transistor DST of each cell string may be connected between a corresponding bit line and drain side dummy memory cells DMC1 and DMC2. The cell strings arranged in a row direction are connected to a drain select line extending in the row direction. The drain select transistors of the cell strings CS11 to CS1$m$ of the first row may be connected to a first drain select line DSL1. The drain select transistors of the cell strings CS21 to CS2$m$ of the second row may be connected to a second drain select line DSL2.

The cell strings arranged in the column direction may be connected to a bit line extending in the column direction. In FIG. 3, the cell strings CS11 and CS21 of a first column are connected to a first bit line BL1. The cell strings CS1$m$ and CS2$m$ of $m^{th}$ column are connected to an $m^{th}$ bit line BLm.

In an embodiment, even bit lines and odd bit lines may be provided instead of the first to $m^{th}$ bit lines BL1 to BLm. Also, even numbered cell strings among the cell strings CS11 to CS1$m$ or CS21 to CS2$m$ arranged in the row direction may be respectively connected to even bit lines, and odd numbered cell strings among the cell strings CS11 to CS1$m$ or CS21 to CS2$m$ arranged in the row direction may be respectively connected to odd bit lines.

Figure 4:
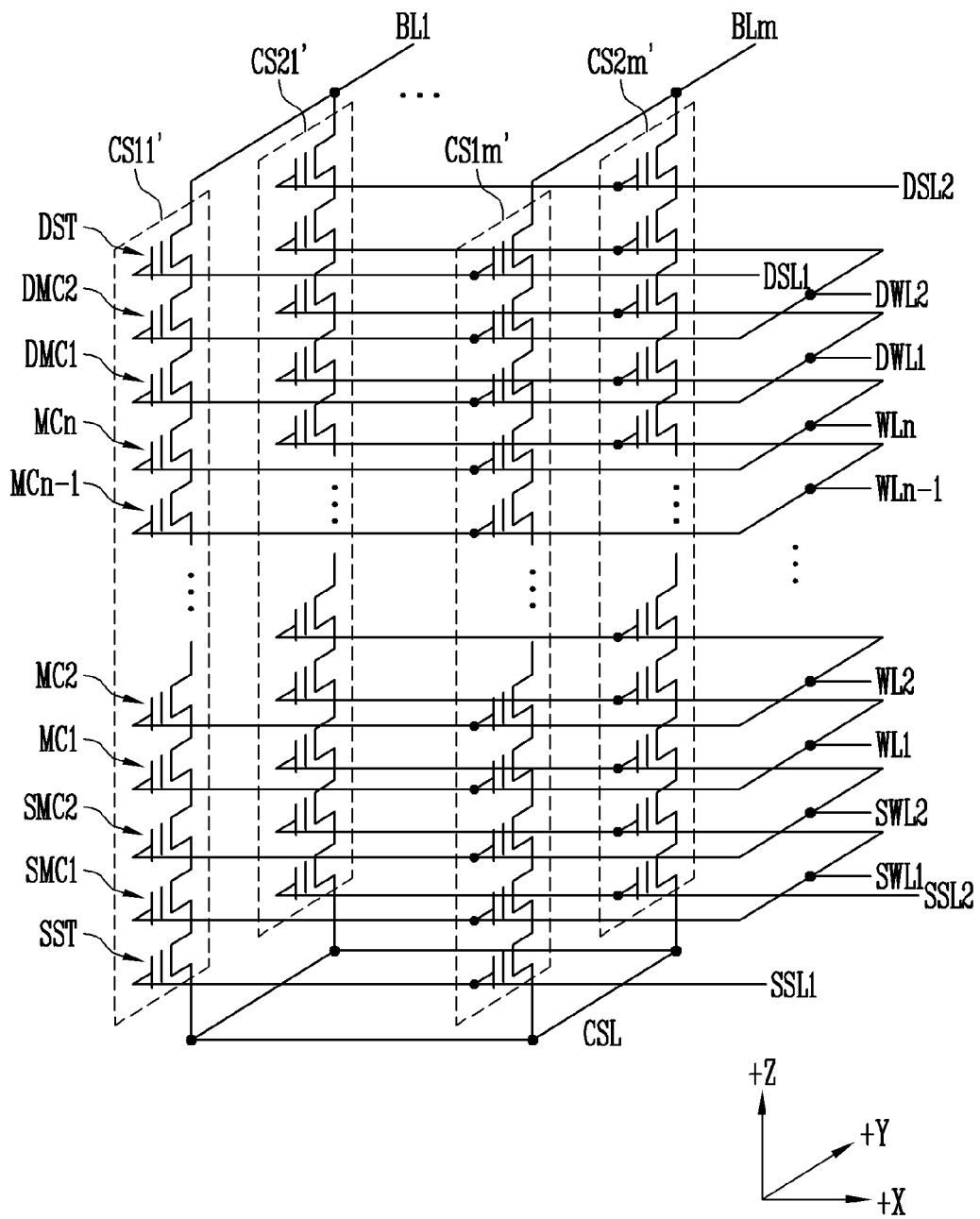
FIG. 4 is a circuit diagram illustrating an example of a representation of an embodiment of any one of memory blocks illustrated in FIG. 2.

FIG. 4 is a circuit diagram illustrating an example of a representation of an embodiment of a memory block (i.e., BLK') of any one memory block (i.e., BLK1) of memory blocks BLK1 to BLKz illustrated in FIG. 2.

Referring to FIG. 4, the first memory block BLK1' may include a plurality of cell strings CS11' to CS1$m$', CS21' to CS2$m$'. The plurality of cell strings CS11' to CS1$m$', CS21' to CS2$m$' may extend in a +Z direction. Each of the plurality of cell strings CS11' to CS1$m$', CS21' to CS2$m$' may include at least one source select transistors SST, at least one of source side dummy memory cells SMC1 and SMC2, and first to $n^{th}$ normal memory cells MC1 to MCn, stacked on a substrate. Each of the plurality of cell strings CS11' to CS1$m$', CS21' to CS2$m$' may include at least one of drain side dummy memory cells DMC1 to DMC2, and at least one drain select transistor DST, stacked on a substrate (not illustrated) disposed under the first memory block BLK1'.

The source select transistor SST of each cell string may be connected between a common source line CSL and the source side dummy memory cells SMC1 and SMC2. The source select transistors of the cell strings (for example, CS11' to CS1$m$') arranged in the same row may be connected to the same source select line (for example, SSL1). The source select transistors of the cell strings (for example, CS11' and CS21') arranged in different rows may be connected to different source select lines (for example, SSL1 and SSL2).

The source side dummy memory cells SMC1 and SMC2 of each cell string may be connected in series between the source select transistor SST and the normal memory cells MC1 to MCn. The source side dummy memory cells at the same height or substantially the same height may be connected to the same source side dummy word line. Gates of the first and second dummy memory cells SMC1 and SMC2 may be connected to the first and second source side dummy word lines SWL1 and SWL2, respectively.

The first to $n^{th}$ normal memory cells MC1 to MCn of each cell string may be connected in series between the source side dummy memory cells SMC1 and SMC2 and the drain side dummy memory cells DMC1 and DMC2. The first to $n^{th}$ normal memory cells MC1 to MCn may be connected to the first to $n^{th}$ normal word lines WL1 to WLn, respectively.

The drain side dummy memory cells DMC1 of each cell string may be connected in series between the drain select transistor DST and the normal memory cells MC1 to MCn. The first and second drain side dummy memory cell DMC1 and DMC2 may be connected to the first and second drain dummy word lines DWL1 and DWL2, respectively.

The drain select transistor DST of each cell string may be connected between a corresponding bit line and the drain side dummy memory cells DMC1 and DMC2. The drain select transistors of the cell strings arranged in a row direction may be connected to a drain select line extending in the row direction. Drain select transistors of the cell strings CS11' to CS1$m$' of a first row may be connected to a first drain select line DSL1. Drain select transistors of the cell strings CS21' to CS2$m$ of a second row may be connected to a second drain select line DSL2.

As a result, the memory block BLK1' illustrated in FIG. 4 has substantially an equivalent circuit similar to the memory block BLK1 illustrated in FIG. 3 except for the omission of the pipe transistor PT in each cell string.

Hereinafter, for convenience of explanation, an example of an embodiment will be explained based on the memory block BLK1 of FIG. 3.

Figure 5:
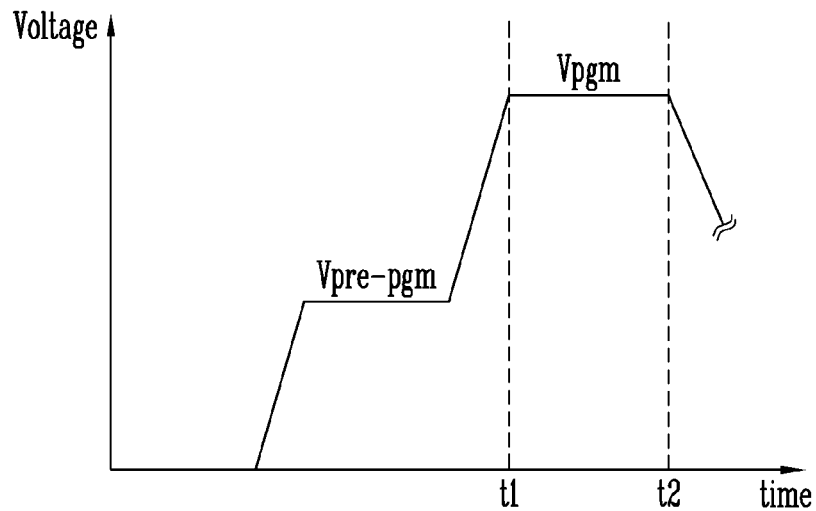
FIG. 5 is a diagram illustrating an example of a representation of a voltage applied to a normal word line selected during a program operation according to an embodiment.

FIG. 5 is a diagram illustrating an example of a representation of a voltage applied to a normal word line selected during a program operation according to an embodiment. In FIG. 5, the horizontal axis represents a time, and the vertical axis represents a voltage.

Referring to FIGS. 3 and 5, in the program operation, a program voltage Vpgm is applied to a selected normal word line. In an embodiment, a voltage of the selected normal word line may reach a preprogram voltage Vpre_pgm, and then, may be increased from the preprogram voltage Vpre_pgm, thereby reaching the program voltage Vpgm.

In the program operation, since source select lines SSL1 and SSL2 of a selected memory block are controlled, cell strings CS11 to CS1$m$, CS21 to CS2$m$ may be electrically separated from a common source line CSL.

A ground voltage may be applied to a non-selected drain select line among drain select lines DSL1 and DSL2 of the selected memory block. Drain select transistors connected to the non-selected drain select line may be turned off, and corresponding cell strings may be electrically separated from bit lines BL1 to BLm.

A power voltage may be applied to a selected drain select line among the drain select lines DSL1 and DSL2 of the selected memory block. Thus, cell strings connected to the selected drain select line are determined as selected cell strings. Also, since a program voltage Vpgm of a high voltage is applied to a selected normal word line, a program operation is performed on memory cells (hereinafter, selected normal memory cells) connected to a selected normal word line among the selected cell strings.

A program is allowed or prohibited on each of the selected normal memory cells based on data transmitted through a corresponding bit line.

When a program allowance voltage (for example, the ground voltage) is applied to a bit line, a corresponding drain select transistor is turned on based on the power voltage of the selected drain select line, and the channel of the corresponding cell string receives a program allowance voltage from the bit line. A threshold voltage of a selected normal memory cell of the corresponding cell string is increased by a difference between the program allowance voltage of the channel and the program voltage Vpgm.

When a program prohibition voltage (for example, the power voltage) is applied to the bit line, the corresponding drain select transistor is turned off based on the power voltage of the selected drain select line, and the channel of the corresponding cell string is separated from the common source line, and thus, floated. A program voltage Vpgm is applied to the selected normal word line, a voltage of the channel of the corresponding cell string is boosted. A difference between the boosted voltage of the channel and the program voltage Vpgm is not large, and thus, the threshold voltage of the selected normal memory cell of the corresponding cell string is not increased.

Here, the program voltage Vpgm is applied to the selected normal word line during a predetermined time. In FIG. 5, the program voltage Vpgm is applied for a period of a first time t1 and a second time t2. A channel of a cell string (hereinafter, referred to as a program prohibition string), to which the program prohibition voltage is applied through a bit line, among the selected cell strings is boosted to a voltage equal to or higher than a predetermined level during the first time t1 to the second time t2. When the voltage of the channel of the program prohibition sting is equal to or lower than the predetermined level, the threshold voltage of the selected normal memory cell of the program prohibition string may be increased based on a difference between the voltage of the channel and the program voltage Vpgm.

Figure 6:
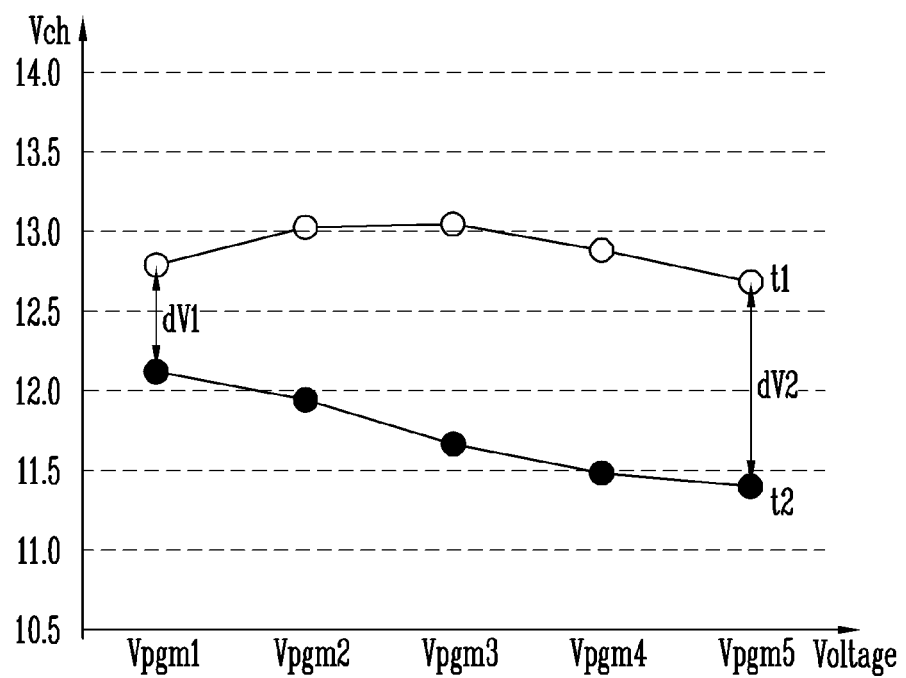
FIG. 6 is a diagram illustrating an example of a representation of a channel voltage of a program prohibition string at a first time and a second time illustrated in FIG. 5 when first to fifth program voltages are applied.

FIG. 6 is a diagram illustrating an example of a representation of a channel voltage Vch of a program prohibition string at a first time t1 and a second time t2 illustrated in FIG. 5 when first to fifth program voltages Vpgm1 to Vpgm5 are applied. In FIG. 6, a horizontal axis represents the program voltage, and a vertical axis represents the channel voltage of the program prohibition string. The first to fifth program voltages Vpgm1 to Vpgm5 are sequentially increasing voltages.

Referring to FIG. 6, when the first program voltage Vpgm1 is applied, a channel voltage of a program prohibition string at the first time t1 is higher than a channel voltage of the program prohibition string at the second time t2 by a first difference value dV1. When the first program voltage Vpgm1 is provided from the first time t1 to the second time t2, the channel voltage of the program prohibition string is decreased by the first difference value dV1.

The decrease of the channel voltage of the program prohibition string by the first difference value dV1, may be caused by, when the channel voltage of the program prohibition string is boosted, an electric field between a channel corresponding to the normal memory cells MC1 to MCn (illustrated in FIG. 3) and a channel corresponding to a select transistor. For example, in the program operation, a high electric field may be formed in a channel corresponding to drain side dummy memory cells DMC1 and DMC2 by a large voltage difference between the channel corresponding to the normal memory cells MC1 to MCn and the channel corresponding to the drain select transistor DST. The above electric field may be increased when the drain side dummy memory cells DMC1 and DMC2 and an adjacent normal memory cell (for example, MCn) among the normal memory cells MC1 to MCn are selected (referring to FIGS. 9 and 10). Based on the above electric field, electron-hole pairs having a high energy are formed in a channel corresponding to the drain side dummy memory cells DMC1 and DMC2, and the generated holes are accumulated peripheral to the drain select transistor DST having a relatively low electric potential. The above holes may cause a leakage current flowing to a corresponding bit line. By the leakage current, the channel voltage of the program prohibition string may be decreased by the first difference value dV1 when the first program voltage Vpgm1 is supplied from the first time t1 to the second time t2. For example, by the large voltage difference between the channel corresponding to the normal memory cells MC1 to MCn and the channel corresponding to the source select transistor SST, a high electric field may be formed in a channel corresponding to the source side dummy memory cells SMC1 and SMC2. The above electric field may cause the leakage current flowing to the common source line.

When the second program voltage Vpgm2, higher than the first program voltage Vpgm1, is applied, a difference between a channel voltage of a program prohibition string at the first time t1 and a channel voltage of a program prohibition string at the second time t2 is increased. As a higher program voltage is used, the difference between the channel voltage of the program prohibition string at the first time t1 and the channel voltage of the program prohibition string at the second time t2 is increased.

When the fifth program voltage Vpgm5 is applied, a channel voltage of a program prohibition string at the second time t2 is lower than the channel voltage of the program prohibition string at the first time t1 by a second difference value dV2. The second difference value dV2 is larger than the first difference value dV1, which may mean more leakage current is generated when the fifth program voltage Vpgm5 is applied. The channel voltage of the program prohibition string at the second time t2 in the example of the application of the fifth program voltage Vpgm5 may be lower than the channel voltage of the program prohibition string at the second time t2 in the example of the application of the first program voltage Vpgm1. The decrease of the channel voltage of the program prohibition string may mean an increase of a threshold voltage of a selected normal memory cell of the program prohibition string.

FIG. 7 is a table illustrating an example of a representation of voltages applied to a selected memory block in a program operation according to an embodiment. Hereinafter, for convenience of explanation, a first drain select line DSL1, for example, is assumed to be selected among first and second drain select lines DSL1 and DSL2.

Referring to FIGS. 3 and 7, a turn-on voltage Vtrn may be applied to a selected drain select line DSL1. The turn-on voltage Vtrn may be, for example, a power voltage. When a program allowance voltage (for example, a ground voltage) is applied to a bit line, a corresponding drain select transistor may be turned on based on a turn-on voltage Vtrn of the selected drain select line DSL1. When a program prohibition voltage (for example, a power voltage) is applied to the bit line, the corresponding drain select transistor may be turned off regardless of the turn-on voltage Vtrn of the selected drain select line DSL1. A cell string (hereinafter, referred to as a program allowance string), which receives a program allowance voltage through the bit line, may be electrically connected to the bit line. The program prohibition string may be electrically separated from the bit line.

A turn-off voltage Vtrf is applied to a non-selected drain select line DSL2. The turn-off voltage Vtrf may be, for example, a ground voltage. Cell strings (hereinafter, referred to as non-selected cell strings) connected to the non-selected drain select line DSL2 may be electrically separated from the bit lines BL1 to BLm.

First and second drain side dummy word line voltages Vdwl1 and Vdwl2 are applied to first and second drain side dummy word lines DWL1 and DWL2, respectively. In an embodiment, the drain side dummy word line voltages Vdwl1 and Vdwl2 may be higher as a corresponding drain side dummy memory cell is more adjacent to (or closer to) a normal memory cell MCn. That is, a first drain side dummy word line voltage Vdwl1 may be higher than a second drain side dummy word line voltage Vdwl2. In an embodiment, the first and second drain side dummy word line voltages Vdwl1 and Vdwl2 may be lower than a pass voltage Vpass.

A program voltage Vpgm of a high voltage is applied to a selected normal word line WLsel among the normal word lines WL1 to WLn. A pass voltage Vpass, lower than the program voltage Vpgm, is applied to non-selected normal word lines WLusel among the normal word lines WL1 to WLn.

First and second source side dummy word line voltages Vswl1 and Vswl2 are applied to first and second source side dummy word lines SWL1 and SWL2, respectively. In an embodiment, the source side dummy word line voltages Vswl1 and Vswl2 may be higher as corresponding source side dummy memory cell is more adjacent to (or closer to) a normal memory cell MC1. That is, a second source side dummy word line voltage Vswl2 may be higher than a first source side dummy word line voltage Vswl2. The first and second source side dummy word line voltages Vswl1 and Vswl2 are lower than the pass voltage Vpass.

In an embodiment, the first source side dummy word line voltage Vswl1 may be equal to the second drain side dummy word line voltage Vdwl2. The second source side dummy word line voltage Vdwl2 may be the same as the first drain side dummy word line voltage Vdwl1.

The turn-off voltage Vtrf is applied to the first and second source select lines SSL1 and SSL2. Source select transistors of the cell strings CS11 to CS1m, CS21 to CS2m may be turned off.

Figure 8:
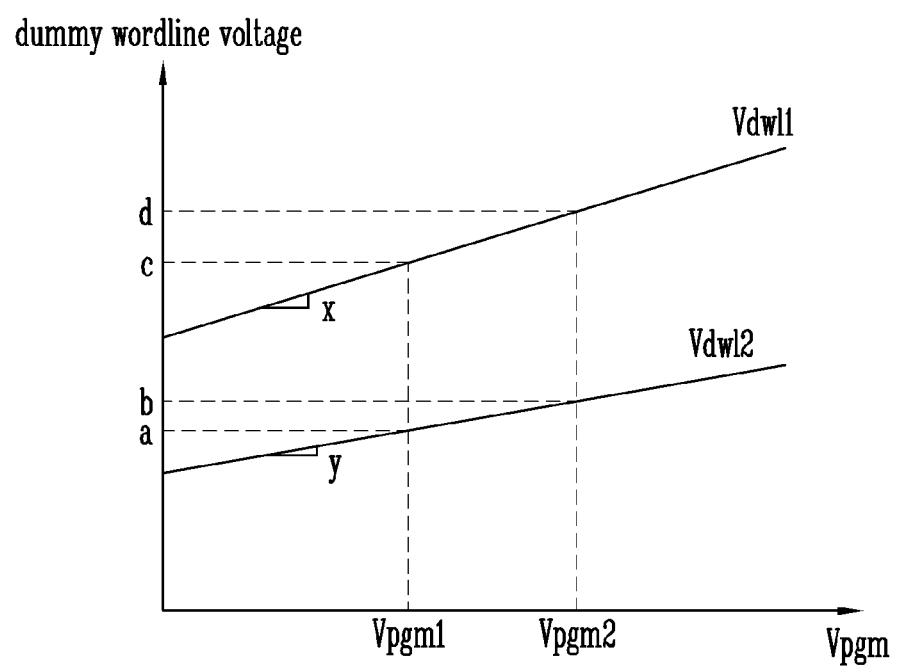
FIG. 8 is a view illustrating an example of a representation of drain side dummy word line voltages according to an embodiment.

FIG. 8 is a view illustrating an example of a representation of drain side dummy word line voltages Vdwl1 and Vdwl2 according to an embodiment.

Referring to FIGS. 3 and 8, as a program voltage Vpgm increases, first and second drain side dummy word line voltages Vdwl1 and Vdwl2 are increased.

When a first program voltage Vpgm1 is applied to a selected normal word line WLsel, a first drain side dummy word line voltage Vdwl1 of a third level 'c' is applied to first drain side dummy word line DWL1. When a second program voltage Vpgm2, higher than the first program voltage Vpgm1, is applied, a first drain side dummy word line voltage Vdwl1 of a fourth level 'd' is applied to the first drain side dummy word line DWL1. An increase (d-c) of the first drain side dummy word line voltage Vdwl1 may be determined as proportional to an increase (Vpgm2-Vpgm1) of the program voltage Vpgm.

When the first program voltage Vpgm1 is applied to the selected normal word line WLsel, a second drain side dummy word line voltage Vdwl2 of a first level 'a' is applied to a second drain side dummy word line DWL2. When the second program voltage Vpgm2 is applied, a second drain side dummy word line voltage Vdwl2 of a second level 'b' is applied to the second drain side dummy word line DWL2. An increase (b-a) of the second drain side dummy word line voltage Vdwl2 may be determined as proportional to an increase (Vpgm2-Vpgm1) of the program voltage Vpgm.

Here, when a normal memory cell (for example, MCn) adjacent to drain side dummy memory cells DMC1 and DMC2 is selected, a higher electric field may be formed in a channel corresponding to the drain side dummy memory cells DMC1 and DMC2. In an embodiment, as the program voltage Vpgm is increased, the first and second drain side dummy word line voltages Vdwl1 and Vdwl2 are increased, which may be performed when the normal memory cell (for example, MCn) adjacent to the drain side dummy memory cells DMC1 and DMC2 is selected.

In an embodiment, a ratio 'x' of an increase of the program voltage Vpgm to an increase of the first drain side dummy word line voltage Vdwl1 may be different from a ratio 'y' of the increase of the program voltage Vpgm to an increase of the second drain side dummy word line voltage Vdwl2. For example, the ratio 'x' may be greater than the ratio 'y'.

Figure 9:
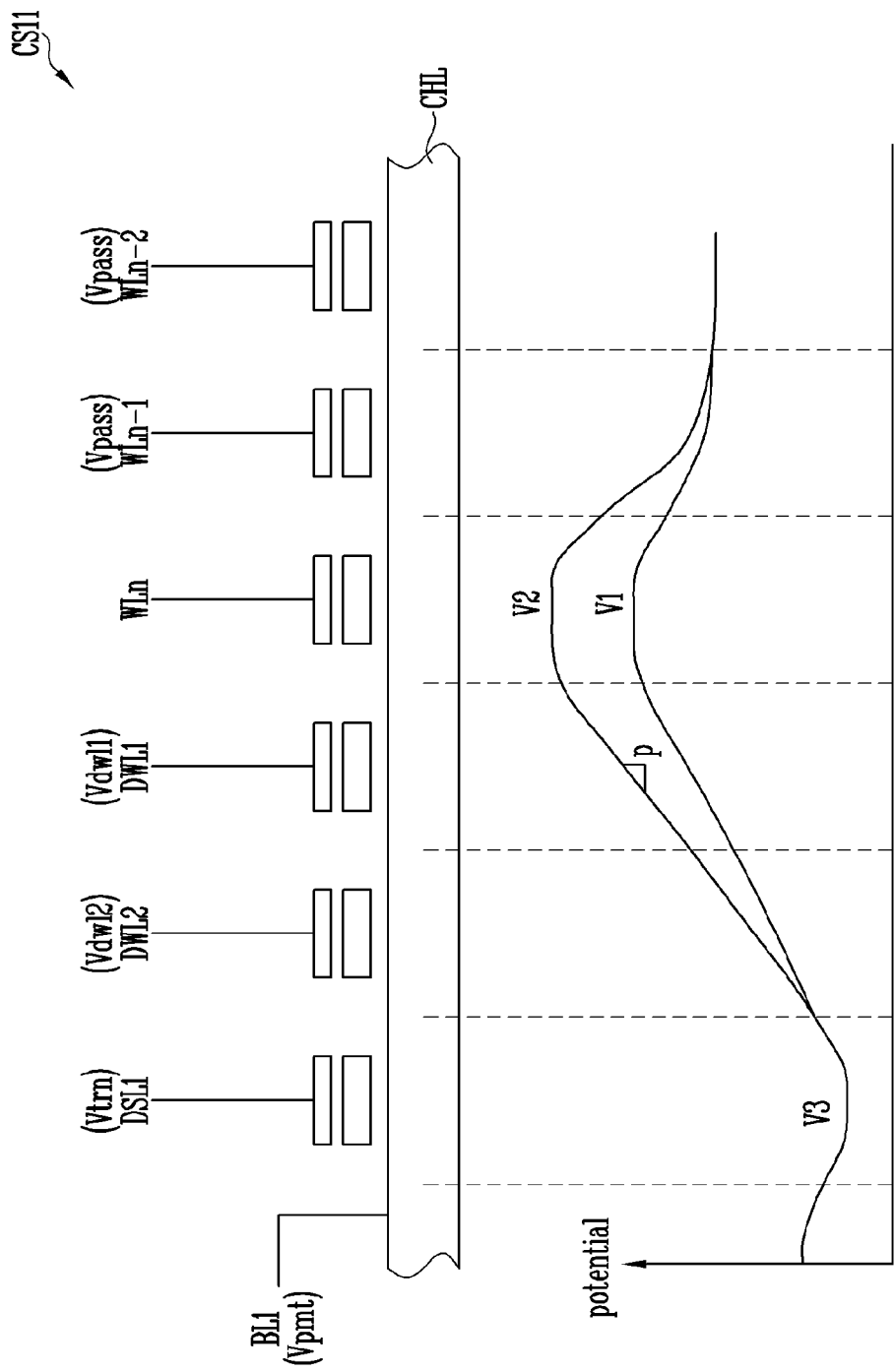
FIGS. 9 to 10 are views illustrating an example of a representation of a channel potential of a program prohibition string among selected cell strings.
Figure 10:
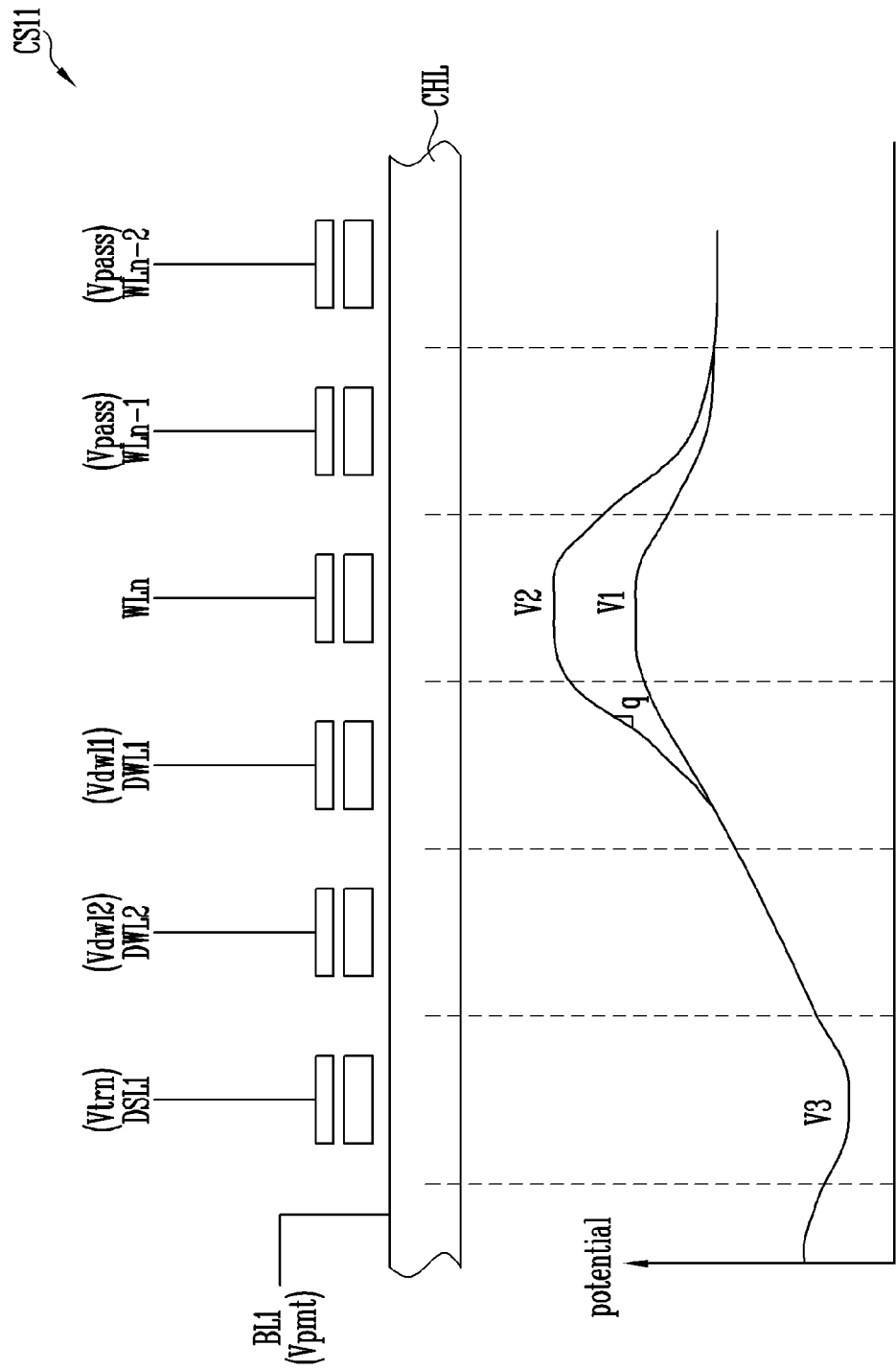

FIGS. 9 to 10 are views illustrating an example of a representation of a channel potential of a program prohibition string among selected cell strings CS11 to CS1m. In the explanation referring to FIGS. 9 and 10, for convenience of explanation, it may be assumed, for example, that a program prohibition voltage is applied to a first bit line BL1.

Firstly, referring to FIGS. 3 and 9, a program prohibition voltage Vpmt may be applied to a first bit line BL1, and a turn-on voltage Vtrn may be applied to a selected drain select line DSL1. The program prohibition voltage Vpmt and the turn-on voltage Vtrn may be power voltages. Thus, a channel to be formed in a channel layer CHL of a cell string CS11 is electrically separated from the first bit line BL1.

It may be assumed, for example, that an $n^{th}$ normal word line WLn is selected. When a first program voltage Vpgm1 is applied to the $n^{th}$ normal word line WLn, an electric potential of a channel layer CHL corresponding to the $n^{th}$ normal memory cell MCn is increased to a first voltage level V1. A pass voltage Vpass, lower than the first program voltage Vpgm1 is applied to remaining normal word lines WL1 to WLn−1. An electric potential of the corresponding channel layer CHL may be increased to a voltage level lower than the first voltage level V1.

The first and second drain side dummy word line voltages Vdwl1 and Vdwl2 are applied to the first and second drain side dummy word lines DWL1 and DWL2, respectively. The second drain side dummy word line voltage Vdwl2 is lower than the first drain side dummy word line voltage Vdwl1. The second drain side dummy word line voltage Vdwl2 is lower than the turn-on voltage Vtrn of the first drain select line DSL1. An electric potential of a channel layer CHL of each of the first and second drain side dummy memory cells DMC1 and DMC2 and the drain select transistor DST is decreased, as the corresponding channel layer is more adjacent to (or closer to) the first bit line BL1. An electric potential of a channel layer CHL of the drain select transistor DST has third voltage level V3.

When a second program voltage Vpgm2, higher than the first program voltage Vpgm1, is applied to the $n^{th}$ normal word line WLn, an electric potential of a channel layer CHL corresponding to the $n^{th}$ normal memory cell MCn is increased to a second voltage level V2 higher than the first voltage level V1. In this example, a difference between the second voltage level V2 and the third voltage level V3 is relatively large.

In an embodiment, when the second program voltage Vpgm2 is applied, increased first and second drain side dummy word line voltages Vdwl1 and Vdwl2 are applied. Thus, a voltage of a channel layer CHL corresponding to the first and second drain side dummy memory cells DMC1 and DMC2 is increased compared with a voltage of the corresponding channel CHL in the example of an application of the first program voltage Vpgm1. Thus, a slope 'p' of an electric potential between the $n^{th}$ normal memory cell MCn and the drain select transistor DST becomes constant. Thus, an electric field of the channel layer CHL corresponding to the drain side dummy memory cells DMC1 and DMC2 in the example of the application of the first program voltage Vpgm1 is greatly increased compared with an electric field of the channel layer CHL corresponding to the drain side dummy memory cells DMC1 and DMC2 in the example of an application of the second program voltage Vpgm2.

It may be assumed, for example, that when the second program voltage Vpgm2 is applied, drain side dummy word line voltages are the same as the drain side dummy word line voltages Vdwl1 and Vdwl2 in the example of the application of the first program voltage Vpgm1. Referring to FIG. 10, a slope 'q' of an electric potential of a predetermined area among the channel layer CHL corresponding to the first and second drain side dummy memory cells DMC1 and DMC2 may be increased. For example, the electric potential may be rapidly changed in the channel layer CHL corresponding to the drain side dummy memory cell DMC1 contacting the $n^{th}$ normal memory cell MCn. Thus, electron-hole pairs having a high energy may be formed, and a leakage current may be generated.

According to an embodiment, when the program voltage Vpgm is increased, increased drain side dummy word line voltages Vdwl1 and Vdwl2 are provided. The electric field between the selected normal word line and the drain select transistor DST may be lowered. Thus, reliability of the program operation may be improved.

Figure 11:
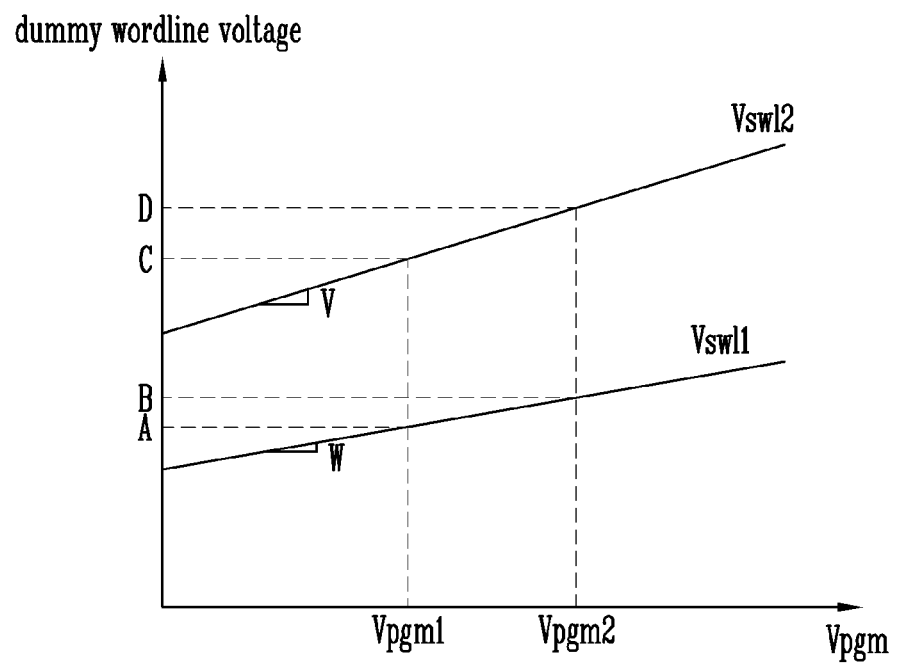
FIG. 11 is a view illustrating an example of a representation of source side dummy word line voltages according to an embodiment.

FIG. 11 is a view illustrating an example of a representation of source side dummy word line voltages Vswl1 and Vswl2 according to an embodiment.

Referring to FIGS. 3 and 11, similar to the first and second drain side dummy word line voltages Vdwl1 and Vdwl2 explained with reference to FIG. 8, as a program voltage Vpgm is increased, the first and second source side dummy word line voltages Vswl1 and Vswl2 are increased. When a first program voltage Vpgm1 is generated, a first source side dummy word line voltage Vswl1 of a first level 'A' and a second source side dummy word line voltage Vswl2 of a third level 'C' are generated. When a second program voltage Vpgm2 is generated, a first source side dummy word line voltage Vswl1 of a second level 'B' and a second source side dummy word line voltage Vswl2 of a fourth level 'D' are generated.

When a normal memory cell (for example, MC1) adjacent to source side dummy memory cells SMC1 and SMC2 is selected, a higher electric field may be formed in a channel layer CHL (referring to FIGS. 9 and 10) corresponding to the source side dummy memory cells SMC1 and SMC2. According to an embodiment, an operation, in which the first and second source side dummy word line voltages Vdwl1 and Vdwl2 are increased as the program voltage Vpgm is increased, may be performed when a normal memory cell (for example, MC1) adjacent to the source side dummy memory cells SMC1 and SMC2 is selected.

In an embodiment, a ratio 'W' between an increase of the program voltage Vpgm and an increase of the first source side dummy word line voltage Vswl1 may be smaller than a ratio 'V' between an increase of the program voltage Vpgm and the second source side dummy word line voltage Vswl2.

Figure 12:
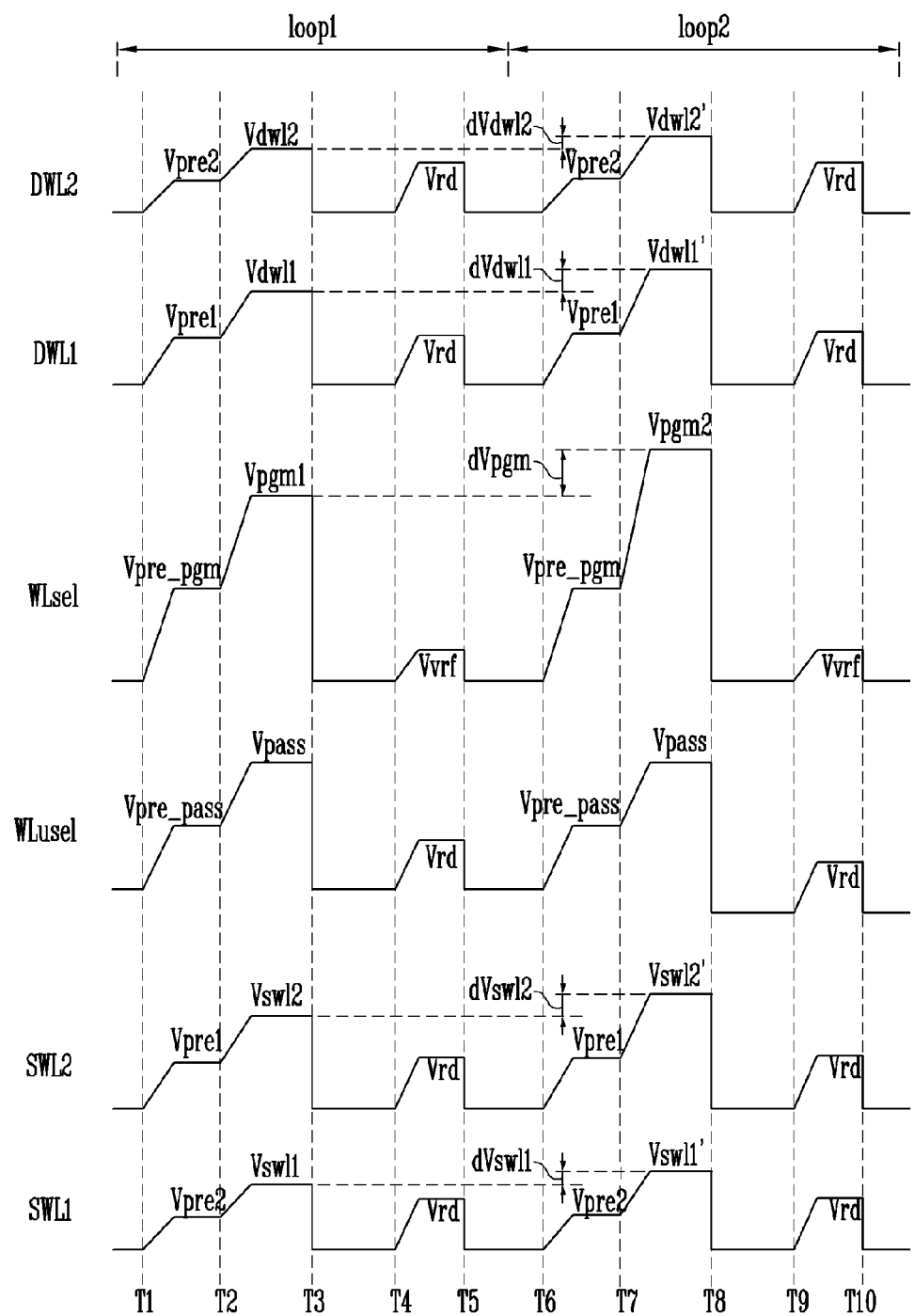
FIG. 12 is a timing diagram illustrating an example of a representation of voltages applied to normal word lines and drain side dummy word lines during a program operation of a semiconductor memory device according to an embodiment.

FIG. 12 is a timing diagram illustrating an example of a representation of voltages applied to normal word lines WL1 to WLn and drain side dummy word lines DWL1 and DWL2 during a program operation of a semiconductor memory device 100 according to an embodiment.

Referring to FIGS. 3 and 12, a program operation may include a plurality of program loops, for example, loop1 and loop2.

Firstly, a first program loop loop1 may be performed. At a first time T1, a preprogram voltage Vpre_pgm may be applied to a selected normal word line WLsel, a prepass voltage Vpre_pass may be applied to a non-selected normal word lines WLusel. First and second prevoltages Vpre1 and Vpre2 may be applied to the first and second drain side dummy word lines DWL1 and DWL2, respectively. A second prevoltage Vpre2 may be applied to a first source side dummy word line SWL1, and a first prevoltage Vpre1 may be applied to a second source side dummy word line SWL2.

At a second time T2, a first program voltage Vpgm1 may be applied to the selected normal word line WLsel, and a pass voltage Vpass may be applied to the non-selected normal word line WLusel. As the first program voltage Vpgm1 is applied, a program is performed in the selected normal memory cells.

First and second drain side dummy word lines voltages Vdwl1 and Vdwl2 may be applied to the first and second drain side dummy word lines DWL1 and DWL2, respectively. The first and second drain side dummy word line voltages Vdwl1 and Vdwl2 are determined based on the first program voltage Vpgm1.

First and second source side dummy word lines voltages Vswl1 and Vswl2 may be applied to the first and second source side dummy word lines SWL1 and SWL2, respectively. The first and second source side dummy word line voltages Vswl1 and Vswl2 are determined based on the first program voltage Vpgm1. In an embodiment, the first source side dummy word line voltage Vswl1 may be the same as the second drain side dummy word line voltage Vdwl2. The second source side dummy word line voltage Vswl2 may be the same as the first drain side dummy word line voltage Vdwl1.

At a third time T3, the first program voltage Vpgm1, the pass voltage Vpass, the first and second drain side dummy word line voltages Vdwl1 and Vdwl2, and the first and second source side dummy word line voltages Vswl1 and Vswl2 are discharged.

Then, an inspection for selected normal memory cells may be performed. At a fourth time T4, a verification voltage Vvrf may be applied to the selected normal word line WLsel. A read-pass voltage Vrd may be applied to the non-selected normal word lines WLusel, the first and second drain side dummy word lines DWL1 and DWL2, and the first and second source side dummy word lines SWL1 and SWL2. By the read-pass voltage Vrd, the drain side dummy memory cells DMC1 and DMC2, non-selected memory cells, and the source side dummy memory cells SMC1 and SMC2 may be turned on regardless of threshold voltages thereof. By the verification voltage Vvrf, a threshold voltage of the selected normal memory cell may be read by a read/write circuit 140 (referring to FIG. 1) through a corresponding bit line. At a fifth time T5, the verification voltage Vvrf and the read-pass voltage Vrd are discharged.

When the threshold voltage of the selected normal memory cell is lower than the verification voltage Vvrf, a second program loop loop2 may be performed.

At a sixth time T6, the preprogram voltage Vpre_pgm may be applied to the selected normal word line WLsel. The prepass voltage Vpre_pass may be applied to the non-selected normal word lines WLusel. The first and second prevoltages Vpre1 and Vpre2 may be applied to the first and second drain side dummy word lines DWL1 and DWL2, respectively. The second prevoltage Vpre2 may be applied to the first source side dummy word line SWL1, and the first prevoltage Vpre1 is applied to the second source side dummy word line SWL2.

At a seventh time T7, a second program voltage Vpgm2, higher than the program voltage Vpgm1, may be applied to the selected normal word line WLsel. The pass voltage Vpass may be applied to the non-selected normal word line WLusel. As the first program voltage Vpgm1 is applied, a reprogram is performed on the selected normal memory cells.

A first drain side dummy word line voltage Vdwl1', increased with respect to a first drain side dummy word line voltage Vdwl1 by a first increment dVdwl1, may be applied to the first drain side dummy word line DWL1. A second drain side dummy word line voltage Vdwl2', increased with respect to a second drain side dummy word line voltage Vdwl2 by a second increment dVdwl2, may be applied to the second drain side dummy word line DWL2. The first increment dVdwl1 may be larger than the second increment dVdwl2.

Increased first and second source side dummy word line voltages Vswl1' and Vswl2' may be applied to the first and second source side dummy word lines SWL1 and SWL2, respectively. A first source side dummy word line voltage Vswl1', increased with respect to a first source side dummy word line voltage Vswl1 by a third increment dVswl1, may be applied to the first source side dummy word line SWL1. A second source side dummy word line voltage Vswl2', increased with respect to a second source side dummy word line voltage Vswl2 by a fourth increment dVswl2, may be applied to the second source side dummy word line SWL2. The fourth incremented dVswl2 may be higher than the third increment dVswl1.

In FIG. 12, it is described that the increased drain side dummy word line voltages Vdwl1' and Vdwl2' are applied to the drain side dummy word lines DWL1 and DWL2, and the increased source side dummy word line voltages Vswl1' and Vswl2' are applied to the source side dummy word lines SWL1 and SWL2. However, it can be understood that the above-mentioned descriptions are examples, and the technical scope of the present embodiments may be variously changed. For example, when the normal memory cell (for example, MCn) adjacent to the drain side dummy memory cells DMC1 and DMC2 is programmed, the increased drain side dummy word line voltages Vdwl1' and Vdwl2' may be applied to the drain side dummy word lines DWL1 and DWL2, however, the source side dummy word line voltages Vswl1 and Vswl2, used in the first program loop loop1, may be applied to the source side dummy word lines SWL1 and SWL2. For example, when the normal memory cell (for example, MC1) adjacent to the source side dummy memory cells SMC1 and SMC2 is programmed, the increased source side dummy word line voltages Vswl1' and Vswl2' may be applied to the source side dummy word lines SWL1 and SWL2, however, the drain side dummy word line voltages Vdwl1 and Vdwl2, used in the first program loop loop1, may be applied to the drain side dummy word lines DWL1 and DWL2. For example, when a memory cell (for example, MCp) disposed in a center among the memory cells MC1 to MCn is programmed, the increased drain side dummy word line voltages Vdwl1' and Vdwl2' may be applied to the drain side dummy word lines DWL1 and DWL2, and the increased source side dummy word line voltages Vdwl1' and Vdwl2' are applied to the source side dummy word lines SWL1 and SWL2.

At an eighth time T8, the second program voltage Vpgm2, the pass voltage Vpass, the increased first and second drain side dummy word line voltages Vdwl1' and Vdwl2', the increased first and second source side dummy word line voltages Vswl1' and Vswl2' are discharged.

An inspection for the selected normal memory cells may be performed. At a ninth time T9, the verification voltage Vvrf may be applied to the selected normal word line WLsel. The read-pass voltage Vrd may be applied to the non-selected normal word lines WLusel, the first and second drain side dummy word lines DWL1 and DWL2, and the first and second source side dummy word lines SWL1 and SWL2.

At a tenth time T10, the verification voltage Vvrf and the read-pass voltage Vrd are discharged.

According to an embodiment, the dummy word line voltages applied to the first and second drain side dummy word lines DWL1 and DWL2, and the first and second source side dummy word lines SWL1 and SWL2 may be increased whenever repeating the program loop.

Figure 13:
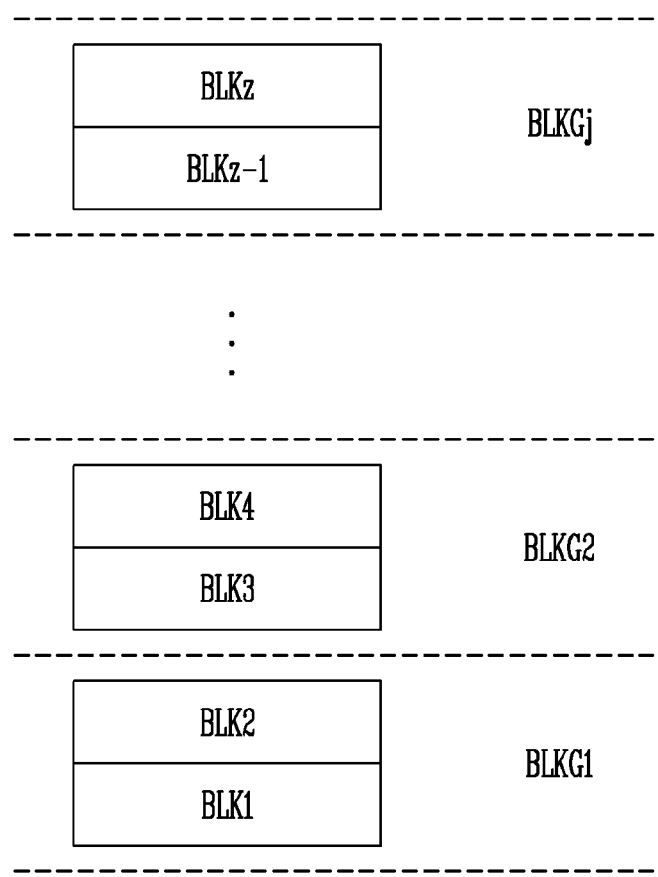
FIG. 13 is a view illustrating an example of a representation of a plurality of memory blocks classified into a plurality of memory block groups.

FIG. 13 is a view illustrating an example of a representation of a plurality of memory blocks BLK1 to BLKz classified into a plurality of memory block groups BLKG1 to BLKGj.

Referring to FIG. 13, the plurality of memory blocks BLK1 to BLKz may be classified into the plurality of memory block groups BLKG1 to BLKGj. Each of the memory block groups BLKG1 to BLKGj may include at least one memory block. In FIG. 13, it is described that one memory block group includes, for example but not limited to, two memory blocks.

Figure 14:
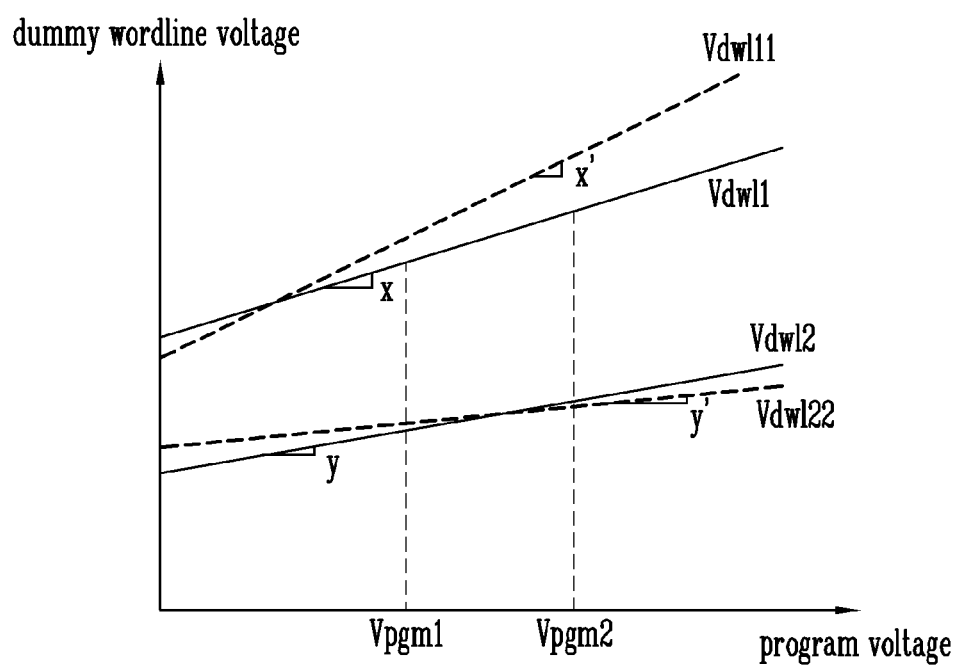
FIG. 14 is a view illustrating an example of a representation of drain side dummy word line voltages when different memory blocks are individually selected.

FIG. 14 is a view illustrating an example of a representation of drain side dummy word line voltages when different memory blocks are individually selected. In FIG. 14, for convenience of explanation, drain side dummy word line voltages Vdwl1 and Vdwl2 corresponding to a $j^{th}$ memory block group BLKGj and drain side dummy word line voltages Vdwl11 and Vdwl22 corresponding to a first memory block group BLKG1 are described for an example.

In FIG. 14, when one memory block (for example, BLKz) is selected among the $j^{th}$ memory block group BLKGj, the first and second drain side dummy word line voltages Vdwl1 and Vdwl2 are provided. As a program voltage Vpgm is increased, the first and second drain side dummy word line voltages Vdwl1 and Vdwl2 are increased. A first drain side dummy word line voltage Vdwl1 has an increase of a ratio 'x' when compared with an increase of the program voltage Vpgm. A second drain side dummy word line voltage Vdwl2 has an increase of a ratio 'y' when compared with the increase of the program voltage Vpgm.

When one memory block (for example, BLK1) is selected from the first memory block group BLKG1, the first and second drain side dummy word line voltages Vdwl11 and Vdwl22 are used. The first drain side dummy word line voltage Vdwl11 has an increase of a ratio 'x"' compared with the increase of the program voltage Vpgm. The second drain side dummy word line voltage Vdwl22 has an increase of a ratio 'y"' compared with the increase of the program voltage Vpgm.

Characteristics of each of the memory blocks BLK1 to BLKz, for example, may not be the same due to an error in a manufacturing process. In an embodiment, different drain side dummy word line voltages may be applied to each memory block group. For example, as illustrated in FIG. 14, the ratio 'x' may be greater than the ratio "x"', and the ratio 'y' may be smaller than the ratio "y"'.

As explained with reference to FIG. 14, different source side dummy word line voltages may be applied to each memory block group.

Figure 15:
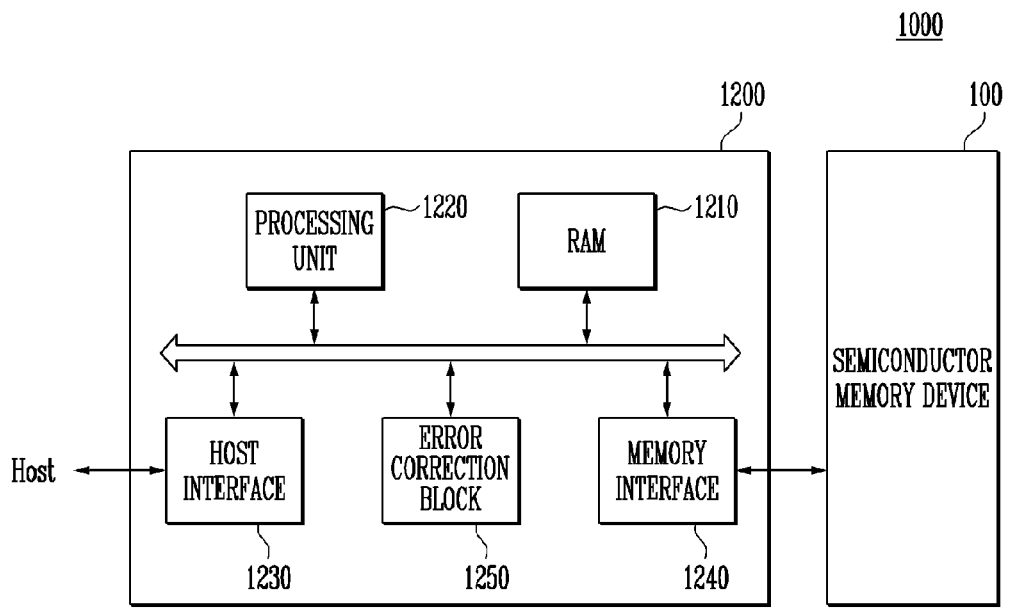
FIG. 15 is a block diagram illustrating an example of a representation of a memory system including the semiconductor memory device illustrated in FIG. 1.

FIG. 15 is a block diagram illustrating an example of a representation of a memory system 1000 including the semiconductor memory device 100 illustrated in FIG. 1.

Referring to FIG. 15, the memory system 1000 may include the semiconductor memory device 100 and a controller 1200.

The semiconductor memory device 100 may have the same structure and operation as illustrated in FIG. 1. Hereinafter, any repetitive explanations will be omitted.

The controller 1200 is connected to a host Host and the semiconductor memory device 100. The controller 1200 is configured to access the semiconductor memory device 100 in response to a request from the host Host. For example, the controller 1200 is configured to control read, write, erase, and background operations of the semiconductor memory device 100. The controller 1200 is configured to provide an interface between the semiconductor memory device 100 and the host Host. The controller 1200 is configured to drive firmware, which is configured to control the semiconductor memory device 100.

The controller 1200 may include a random access memory (RAM) 1210, a processing unit 1220, and a host interface 1230. The controller 1200 may include a memory interface 1240 and an error correction block 1250.

The RAM 1210 is configured to be used as at least one of an operation memory of the processing unit 1220, a cache memory interposed between the semiconductor memory device 100 and the host Host, and a buffer memory interposed between the semiconductor memory device 100 and the host Host.

The processing unit 1220 may control overall operations of the controller 1200.

The host interface 1230 may include a protocol configured to perform data exchange between the host Host and the controller 1200. In an embodiment, the controller 1200 is configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The memory interface 1240 interfaces with the semiconductor memory device 100. For example, the memory interface 1240 may include a NAND interface or a NOR interface.

The error correction block 1250 detects and corrects an error in data received from the semiconductor memory device 100 using an error correction code (ECC).

The semiconductor memory device 100 explained with reference to FIGS. 1 to 14 is provided to the memory system 1000, and thus, the memory system 1000 having improved reliability may be provided.

The controller 1200 and the semiconductor memory device 100 may be integrated into one semiconductor device. In an embodiment, the controller 1200 and the semiconductor memory device 100 may be integrated into one semiconductor device, and thus constitute a memory card. For example, the controller 1200 and the semiconductor memory device 100 are integrated into one semiconductor device, and thus constitute a memory card such as a PC card, a personal computer memory card international association (PCMCIA), a compact flash card (CF), a smart media card (SM, SMC), a memory stick, a multimedia card (MMC, RS-MMC, MMC-micro), an SD card (SD, miniSD, microSD, SDHC), a universal flash storage device (UFS), etc.

The controller 1200 and the semiconductor memory device 100 are integrated into one semiconductor device, and thus, constitute a solid state drive (SSD). The SSD may include a storage media configured to store data in a semiconductor memory. When the memory system 1000 is used as the SSD, an operation speed of the host Host connected to the memory system 1000 may be greatly increased.

In an embodiment, the memory system 1000 may be supplied to one of a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio decoder, a digital audio player, a digital picture decoder, a digital picture player, a digital video decoder, a digital video player, a device to receive or transmit information in a wireless environment, one of various electronic devices included in a home network, one of various electronic devices included in a computer network, one of various electronic devices included in a telematics network, an RFID device, one of various structural parts included in a computing system, and/or the like.

In an example of an embodiment, the semiconductor memory device 100 or the memory system 1000 may be mounted as a package having various shapes. For example, the semiconductor memory device 100 or the memory system 1000 may be mounted by a package type such as a package on package (PoP), ball grid arrays (BGAs), chip scale packages (CSPs), a plastic leaded chip carrier (PLCC), a plastic dual in line package (PDIP), a die in wafer pack, a die in wafer form, a chip on board (COB), a ceramic dual in line package (CERDIP), a plastic metric quad flatpack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), and/or the like.

Figure 16:
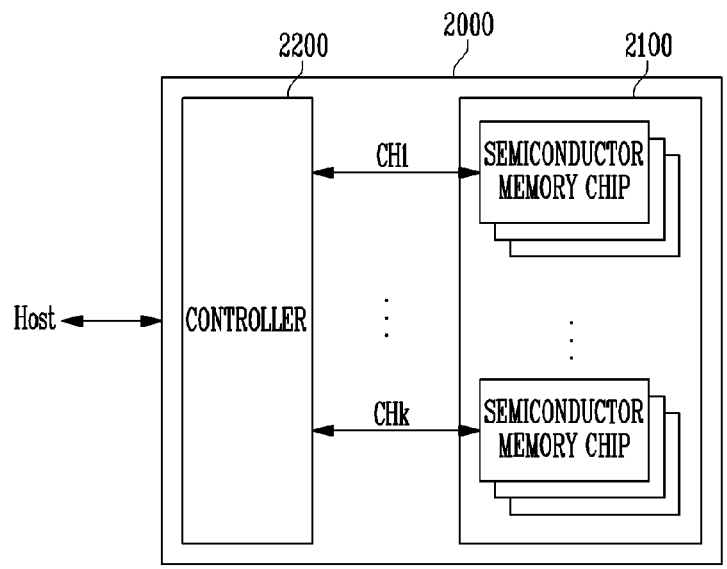
FIG. 16 is a block diagram illustrating an example of a representation of an application embodiment of the memory system illustrated in FIG. 15.

FIG. 16 is a block diagram illustrating an example of a representation of an application embodiment 2000 of the memory system 1000 illustrated in FIG. 15.

Referring to FIG. 16, the memory system 2000 may include a semiconductor memory device 2100 and a controller 2200. The semiconductor memory device 2100 may include a plurality of semiconductor memory chips. The plurality of semiconductor memory chips are classified into a plurality of groups.

In FIG. 16, the plurality of groups are described to communicate with the controller 2200 through first to $k^{th}$ channels CH1 to CHk, respectively. Each semiconductor memory chip may have the same structure and operation as the semiconductor memory device 100 illustrated in FIG. 1.

Each group may be configured to communicate with the controller 2200 through one common channel. The controller 2200 may be configured to be the same as the controller 1200 illustrated in FIG. 15, and to control the plurality of memory chips of the semiconductor memory device 2100 through the plurality of channels CH1 to CHk.

In FIG. 16, the plurality of semiconductor memory chips is illustrated as being connected to one channel. However, it will be understood that the memory system 2000 may be changed so that one semiconductor memory chip is connected to one channel.

Figure 17:
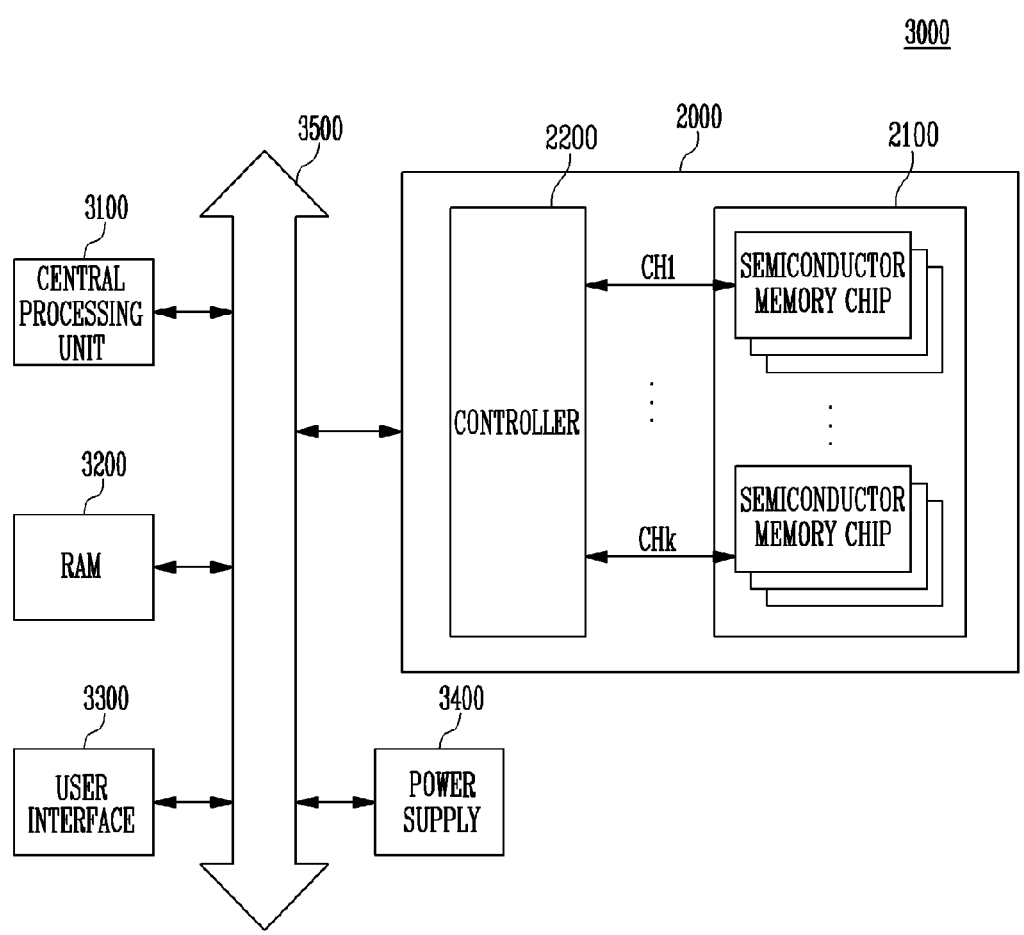
FIG. 17 is a block diagram illustrating an example of a representation of a computing system including the memory system illustrated with reference to FIG. 16.

FIG. 17 is a block diagram illustrating an example of a representation of a computing system 3000 including the memory system 2000 illustrated with reference to FIG. 16.

Referring to FIG. 17, the computing system 3000 may include a central processing unit 3100, a RAM 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided from the user interface 3300 or processed by the central processing unit 3100 is stored in the memory system 2000.

In FIG. 17, the semiconductor memory device 2100 is illustrated as being connected to the system bus 3500 through the controller 2200. However, the semiconductor memory device 2100 may be configured to be directly connected to the system bus 3500. In this example, the operation of the controller 2200 may be performed by the central processing unit 3100 and the RAM 3200.

In FIG. 17, the memory system 2000 illustrated in FIG. 16 is provided. However, the memory system 2000 may be substituted by the memory system 1000 illustrated in FIG. 15. In an embodiment, the computing system 3000 may include both of the memory systems 1000 and 2000 illustrated in FIGS. 15 and 16.

According to the various embodiments, when the program voltage is increased, the dummy word line voltages may also be increased. In the program operation, the electric field formed in the dummy memory cells may be decreased. Therefore, the semiconductor memory device, which may have increased reliability, is provided.

According to the various examples of embodiments, the semiconductor memory device having perhaps increased reliability, and the method of programming the same are provided.

Although the present application is explained with reference to the various examples of embodiments, it will be apparent to those skilled in the art that various modifications can be made to the above-described embodiments without departing from the spirit or scope of the application.

What is claimed is:

1. A semiconductor memory device comprising:
   a memory cell array including a plurality of normal memory cells, a select transistor, and a dummy memory cell connected between the plurality of normal memory cells and the select transistor;
   a voltage generator configured for generating a program voltage applied to a normal memory cell selected among the plurality of normal memory cells, and for generating a dummy word line voltage applied to the dummy memory cell in a program operation; and
   a control logic configured for controlling the voltage generator to adjust the dummy word line voltage based on the program voltage.

2. The semiconductor memory device of claim 1, wherein when the program voltage of a first voltage level is generated, the voltage generator generates the dummy word line voltage of a second voltage level, and when the program voltage of a third voltage level greater than the first voltage level is generated, the voltage generator generates the dummy word line voltage of a fourth voltage level greater than the second voltage level.

3. The semiconductor memory device of claim 1, wherein the dummy word line voltage is adjusted in proportion to the program voltage.

4. The semiconductor memory device of claim 1, wherein the dummy word line voltage is set to increase as the program voltage increases.

5. The semiconductor memory device of claim 1, wherein first and second program loops are performed during the program operation, the voltage generator generates the program voltage and the dummy word line voltage during the first program loop, the voltage generator generates a second program voltage higher than the program voltage, and a second dummy word line voltage higher than the dummy word line voltage during the second program loop, and the second program voltage and the second dummy word line voltage are applied to the selected normal memory cell and the dummy memory cell, respectively.

6. The semiconductor memory device of claim 1, wherein the selected normal memory cell is a normal memory cell adjacent to the dummy memory cell among the plurality of normal memory cells.

7. The semiconductor memory device of claim 1, wherein the dummy memory cell is connected to a bit line through the select transistor.

8. The semiconductor memory device of claim 1, wherein the dummy memory cell is connected to a common source line through the select transistor.

9. The semiconductor memory device of claim 1, wherein the voltage generator further generates a pass voltage to be applied to non-selected normal memory cells among the plurality of normal memory cells, wherein the dummy word line voltage is lower than the pass voltage, and the program voltage is higher than the pass voltage.

10. A semiconductor memory device comprising:
    a plurality of memory blocks including a plurality of normal memory cells, a select transistor, and a plurality of dummy memory cells connected between the plurality of normal memory cells and the select transistor; and
    a peripheral circuit configured for applying first and second dummy word line voltages to first and second dummy memory cells among the plurality of dummy memory cells when a first program voltage is applied to a selected normal memory cell among the plurality of normal memory cells of a selected memory block,
    wherein the peripheral circuit applies a third dummy word line voltage, higher than the first dummy word line voltage, to the first dummy memory cell and applies a fourth dummy word line voltage, higher than the second dummy word line voltage, to the second dummy memory cell, when a second program voltage, higher than the first program voltage, is applied to the selected normal memory cell.

11. The semiconductor memory device of claim 10, wherein the first dummy memory cell is located closer to the plurality of normal memory cells than the second dummy memory cell is located from the plurality of normal memory cells.

12. The semiconductor memory device of claim 11, wherein a first difference value between the first and third dummy word line voltages is greater than a second difference value between the second and fourth dummy word line voltages.

13. The semiconductor memory device of claim 11, wherein the first dummy word line voltage is higher than the second dummy word line voltage, and the third dummy word line voltage is higher than the fourth dummy word line voltage.

14. The semiconductor memory device of claim 10, wherein a program operation for the selected normal memory cell includes first and second program loops, the first program voltage is applied during the first program loop, and the second program voltage is applied during the second program loop.

15. The semiconductor memory device of claim 10, wherein the selected normal memory cell is a normal memory cell adjacent to the plurality of dummy memory cells among the plurality of normal memory cells.

16. The semiconductor memory device of claim 10, wherein a first difference value between the first and third dummy word line voltages and a second difference value between the second and fourth dummy word line voltages are proportional to a difference between the first and second program voltages.

17. The semiconductor memory device of claim 10, wherein a first difference value between the first and third dummy word line voltages and a second difference value between the second and fourth dummy word line voltages are changed based on the selected memory block.

18. A method of programming a semiconductor memory device including a memory cell array, wherein the memory cell array includes a plurality of normal memory cells, a select transistor, and a dummy memory cell connected between the plurality of normal memory cells and the select transistor, and the method comprising:
    applying a first program voltage to a memory cell selected among the plurality of normal memory cells and applying a first dummy word line voltage to the dummy memory cell to perform a first program loop; and after the first program loop, applying a second program voltage, higher than the first program voltage, to the selected memory cell and applying a second dummy word line voltage, higher than the first dummy word line voltage, to the dummy memory cell to perform a second program loop.

19. The method of claim 18, wherein a difference value between the first and second dummy word line voltages is proportional to a difference value between the first and second program voltages.

20. The method of claim 18, wherein the selected normal memory cell is a normal memory cell adjacent to the dummy memory cell among the plurality of normal memory cells.

* * * * *